US010685881B2

(12) United States Patent
Zang et al.

(10) Patent No.: US 10,685,881 B2
(45) Date of Patent: Jun. 16, 2020

(54) METHODS, APPARATUS, AND MANUFACTURING SYSTEM FOR SELF-ALIGNED PATTERNING OF CONTACTS IN A SEMICONDUCTOR DEVICE

(71) Applicant: GLOBALFOUNDRIES INC., Grand Cayman (KY)

(72) Inventors: Hui Zang, Guilderland, NY (US); Guowei Xu, Ballston Lake, NY (US); Haiting Wang, Clifton Park, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 16/112,511

(22) Filed: Aug. 24, 2018

(65) Prior Publication Data

US 2020/0066588 A1  Feb. 27, 2020

(51) Int. Cl.
| | |
|---|---|
| *H01L 21/70* | (2006.01) |
| *H01L 21/768* | (2006.01) |
| *H01L 29/78* | (2006.01) |
| *H01L 29/06* | (2006.01) |
| *H01L 29/49* | (2006.01) |
| *H01L 23/535* | (2006.01) |
| *H01L 23/532* | (2006.01) |
| *H01L 29/66* | (2006.01) |

(52) U.S. Cl.
CPC .. *H01L 21/76897* (2013.01); *H01L 21/76805* (2013.01); *H01L 21/76895* (2013.01); *H01L 23/535* (2013.01); *H01L 23/53209* (2013.01); *H01L 23/53257* (2013.01); *H01L 29/0649* (2013.01); *H01L 29/4983* (2013.01); *H01L 29/6656* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | | |
|---|---|---|---|---|
| 2005/0020020 A1* | 1/2005 | Collaert | .......... | H01L 21/823821 438/300 |
| 2015/0295089 A1* | 10/2015 | Huang | ................ | H01L 29/7853 257/401 |
| 2017/0110549 A1* | 4/2017 | Xie | ................... | H01L 29/41783 |
| 2017/0236821 A1* | 8/2017 | Kim | ................. | H01L 21/82345 257/401 |

\* cited by examiner

*Primary Examiner* — Calvin Y Choi
(74) *Attorney, Agent, or Firm* — Williams Morgan, P.C.

(57) ABSTRACT

A method, apparatus, and manufacturing system are disclosed for a fin field effect transistor having a reduced risk of short circuits between a gate and a source/drain contact. In one embodiment, we disclose a semiconductor device including a fin structure comprising a fin body, source/drain regions, and a metal formation disposed above the source/drain regions, wherein the metal formation has a first height; and a gate structure between the source/drain regions, wherein each gate structure comprises spacers in contact with the metal formation, wherein the spacers have a second height less than the first height, a metal plug between the spacers and below the second height, and a T-shaped cap above the metal plug and having the first height.

20 Claims, 9 Drawing Sheets

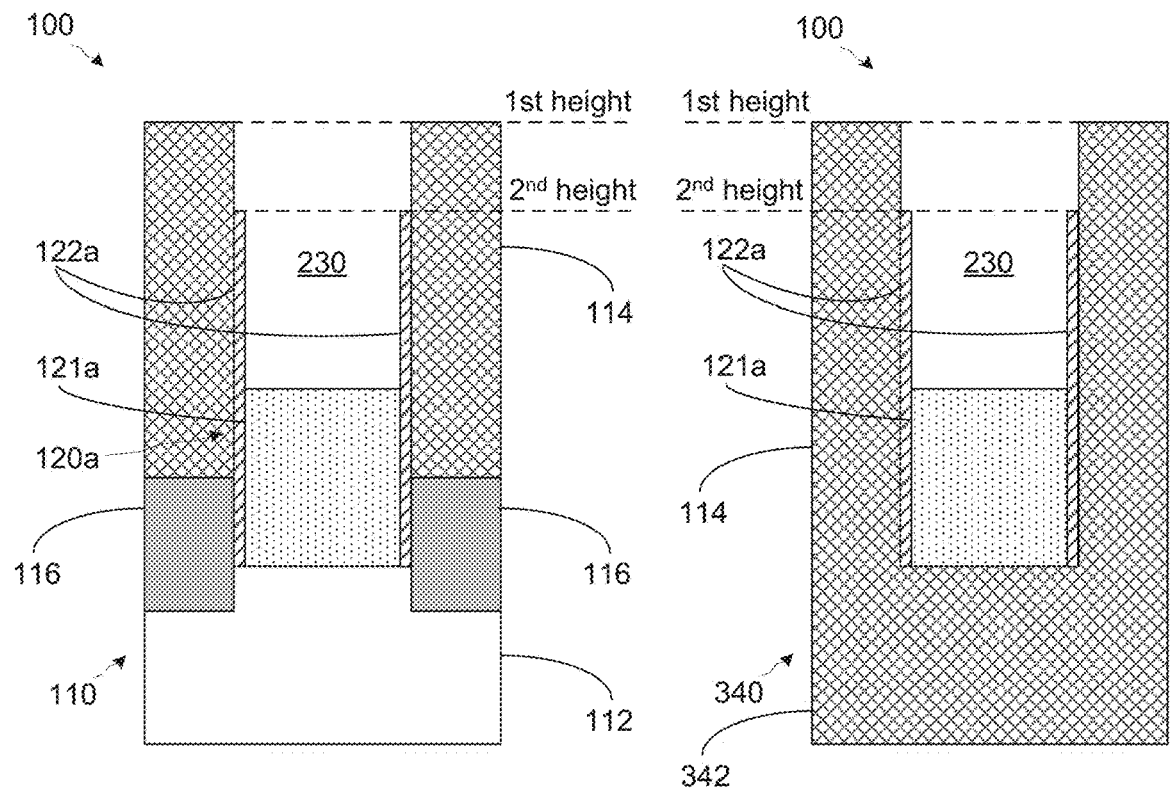
Fig. 2
Fig. 3
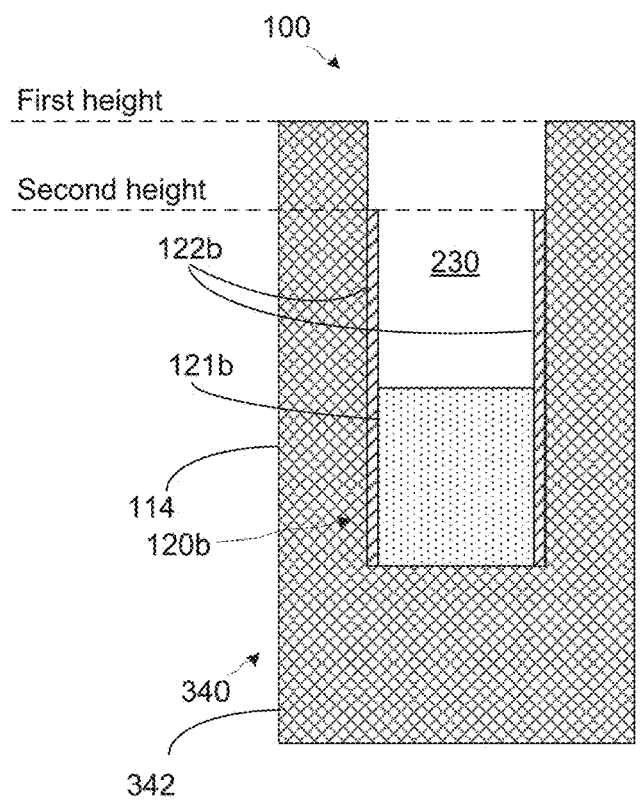
Fig. 4

METHODS, APPARATUS, AND MANUFACTURING SYSTEM FOR SELF-ALIGNED PATTERNING OF CONTACTS IN A SEMICONDUCTOR DEVICE

BACKGROUND OF THE INVENTION

Field of the Invention

Generally, the present disclosure relates to the manufacture of sophisticated semiconductor devices, and, more specifically, to various methods for forming contacts in a semiconductor device.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide semiconductor field effect transistors (MOSFETs or FETs) represent one significant type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by a voltage applied to the gate electrode. If a voltage that is less than a threshold voltage of the device is applied to the gate electrode, then there is substantially no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

In contrast to a planar FET, which has a flat structure, there are so-called 3D devices, which may be termed fin-FETs. More specifically, in such 3D devices, a generally vertically positioned, fin-shaped active area is formed and a gate electrode encloses both of the sides and the upper surface of the fin-shaped active area to produce a channel having a 3-dimensional structure instead of a planar structure. In some cases, an insulating cap layer, e.g., silicon nitride is positioned at the top of the fin-shaped active areas.

FinFET designs form "fins" on the surface of a semiconductor wafer using selective-etching processes. The fins may be used to form a raised channel between the source and drain of a transistor. The gate is then deposited such that it wraps around the fin. This 3-dimensional channel is relatively thin, and thus, the gate generally has significant control over the carriers within. However, in later processing steps, when first contacts are formed from the source or drain to a first conductive element overlying both the fin and the gate and second contacts are formed from the gate to a second overlying conductive elements, the first and second contacts may be positioned so extremely close (on the order of one or a few nanometers) to one another that minor positioning errors in processing may lead to unwanted electrical communication between the first and second contacts, i.e., to short circuits.

It would be desirable to form FinFET devices with reduced risk of short circuits between gates and sources/drains.

SUMMARY OF THE INVENTION

It would be desirable to reduce a risk of short circuits between a gate and a source/drain contact in a FinFET device.

The following presents a brief summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus, and manufacturing systems for fabricating a FinFET device with self-aligned caps. In one embodiment, the present disclosure provides a method, including forming a fin structure comprising source/drain regions and dummy oxide regions disposed above the source/drain regions, wherein the dummy oxide regions have a first height; forming gate structures between the source/drain regions, wherein each gate structure comprises spacers in contact with the dummy oxide regions, wherein the spacers have a second height less than the first height, thereby providing a first T-shaped space above each gate structure; filling each first T-shaped space with a first metal, to yield a plurality of T-shaped first metal formations; recessing at least one T-shaped first metal formation to below the second height, thereby yielding at least one recessed first metal formation and providing a second T-shaped space above each at least one recessed first metal formation, wherein at least one T-shaped first metal formation is not recessed; and filling each second T-shaped space with a nitride.

In one embodiment, the present disclosure provides a semiconductor device containing a fin structure comprising a fin body, source/drain regions, and a metal formation disposed above the source/drain regions, wherein the metal formation has a first height; and a gate structure between the source/drain regions, wherein each gate structure comprises spacers in contact with the metal formation, wherein the spacers have a second height less than the first height, a metal plug between the spacers and below the second height, and a T-shaped cap above the metal plug and having the first height.

In one embodiment, the present disclosure provides a semiconductor device manufacturing system adapted to perform a method, such as is summarized above.

BRIEF DESCRIPTION OF THE DRAWINGS

The disclosure may be understood by reference to the following description taken in conjunction with the accompanying drawings, in which like reference numerals identify like elements, and in which:

FIG. 2 illustrates a cross-sectional X1 cut view of a semiconductor device after a first stage of processing, in accordance with embodiments herein;

FIG. 3 illustrates a cross-sectional X2 cut view of a semiconductor device after a first stage of processing, in accordance with embodiments herein;

FIG. 4 illustrates a cross-sectional X3 cut view of a semiconductor device after a first stage of processing, in accordance with embodiments herein;

Figure 1:
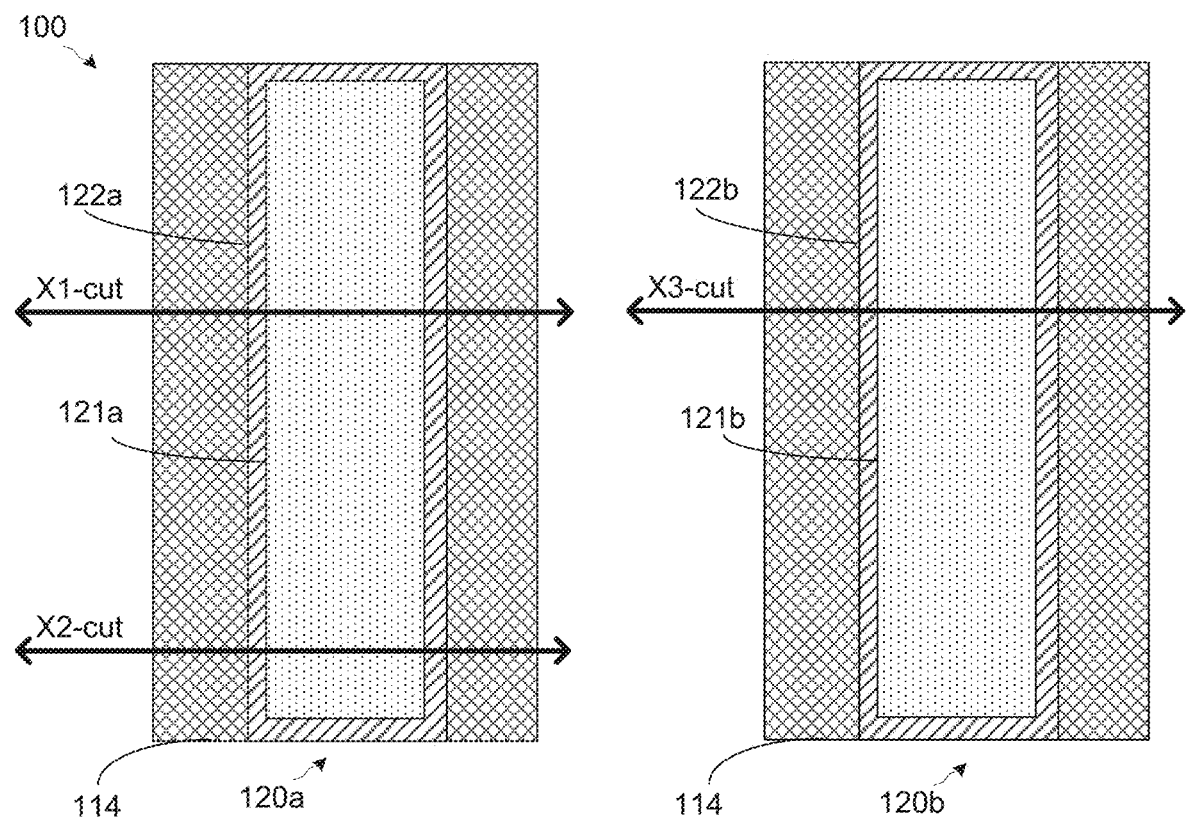
FIG. 1 illustrates a stylized plan depiction of portions of a semiconductor device, showing an X1 cut, an X2 cut, and an X3 cut, from each of which one or more cross-sectional depictions in subsequent figures may be shown.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for forming fin field effect transistor (FinFET) devices with self-aligned caps. Such FinFET devices may have reduced risk of short circuits between gates and source/drain contacts.

FIG. 1 illustrates a stylized plan depiction of portions of a semiconductor device 100 in accordance with embodiments herein. A first portion comprises, as seen from above, a first gate structure 120a. The gate structure first 120a may comprise first gate 121a. The first gate 121a may comprise a liner and a work function metal (WFM) disposed on the liner. The first gate 121a may include any arrangement, dimensions, and type of liner, WFM, and/or other components known to the person of ordinary skill in the art having the benefit of the present disclosure.

Adjacent to and in contact with sidewalls of the first gate 121a is a first spacer 122a. The first spacer 122a may comprise any suitable material and be disposed with any appropriate thickness as a routine matter for the person of ordinary skill in the art.

The first gate structure 120a has a substantially rectangular shape with a long axis (vertical on the page) and a short axis (horizontal on the page).

Adjacent to and in contact with the spacer first 122a are dummy oxide regions 114. The dummy oxide regions 114 may comprise any appropriate oxide material known to the person of ordinary skill in the art. In one embodiment, the dummy oxide regions 114 comprise silicon oxide.

A second portion of the semiconductor device 100 comprises a second gate structure 120b comprising a second gate 121b and a second spacer 122b. The second gate 121b may be identical in arrangement, dimensions, and/or type of components to the first gate 121a. Similarly, the second spacer 122b may comprise the same material and be disposed with the same thickness as the first spacer 122a. The second portion of the semiconductor device 100 also comprises dummy oxide regions 114.

For the sake of brevity, only one gate structure 120a or 120b is shown in each portion of the semiconductor device. Each portion of the semiconductor device 100 may comprise additional gate structures 120a or 120b and dummy oxide regions 114, typically in a repeating pattern. Also, although gate structures 120a and 120b are described as different structures, in embodiments, the second gate structure 120b may be integral with the first gate structure 120a, i.e., the second portion of the semiconductor device 100 may be laterally disposed from the first portion such that the long axis of the first gate structure 120a may extend into the second portion of the semiconductor device 100, where the portion of the first gate structure 120a so extending may be considered a second gate structure 120b.

Subsequent stylized cross-sectional depictions of the semiconductor device 100 according to embodiments herein will be taken along one of three cuts: an X1 cut (through and parallel to the long axis of a fin lying under the first gate structure 120a, wherein the long axis of the fin is perpendicular to the long axis of the first gate structure 120a), an X2 cut (through an isolation region disposed adjacent to the fin depicted in X1 cut), and an X3 cut (through an isolation region).

FIGS. 2-19 illustrate stylized cross-sectional depictions of the semiconductor device 100 under various stage of manufacture, in accordance with embodiments herein.

FIG. 2 illustrates a cross-sectional X1 cut view of a semiconductor device 100; FIG. 3 illustrates a cross-sectional X2 cut view of a semiconductor device 100; and FIG. 4 illustrates a cross-sectional X3 cut view of a semiconductor device 100, all after a first stage of processing, in accordance with embodiments herein.

In the first stage of processing, a fin structure 110 is formed on a suitable substrate (not shown). Suitable substrates include, but are not limited to, bulk silicon and silicon-on-insulator (SOI), among others. The fin structure 110 comprises a fin body 112. The fin body 112 may be formed by any appropriate technique. For example, if the fin body 112 comprises the same material as the substrate, then the fin body 112 may be formed by patterning the substrate. For another example, the fin body 112 may be formed by depositing one or more layers, either on a masked substrate with subsequent removal of the mask, or over an entire substrate region, with the deposited layers subsequently patterned to yield the final fin body 112.

In addition to the fin body 112, the fin structure 110 comprises a plurality of source/drain (S/D) regions 116. The S/D regions 116 may have tops elevated above the top of the fin body 112, as is shown in FIG. 2; or the tops of the S/D regions 116 may be coplanar with or recessed below the top of the fin body 112. The S/D regions 116 may comprise any material known to the person of ordinary skill in the art. In one embodiment, the S/D regions 116 may comprise epitaxial silicon, doped epitaxial silicon, epitaxial silicon/germanium, or doped epitaxial silicon/germanium. Forming S/D regions 116 is a routine matter for the person of ordinary skill in the art having the benefit of the present disclosure.

In one embodiment, the S/D regions 116 are epitaxial source/drain regions each having a top above a top of the fin body 112.

Disposed above the S/D regions 116 are the dummy oxide regions 114. The dummy oxide regions 114 have a first height, meaning the tops of the dummy oxide regions 114 are at a particular elevation above the bottom of the gate structures 120a and 120b.

The first stage of processing also involves forming the gate structures 120a between the source/drain regions 116. As discussed above regarding FIG. 1, each gate structure 120a, 120b comprises a gate 121a or 121b and spacers 122a or 122b in contact with the dummy oxide regions 114. Not visible in the plan view of FIG. 1 was a height difference between the spacers 122a or 122b and the dummy oxide regions 114. As shown in FIGS. 2-4, the spacers 122a or 122b have a second height less than the first height. Accordingly, after the first stage of processing there exists a first T-shaped space 230 above each gate structure 120a, 120b. The first T-shaped space 230 is bounded by the top of the first or second gate 121a, 121b; the first or second spacer 122a, 122b on a lower portion of each side; the dummy oxide regions 144 on an upper portion of each side; and by the first height.

In one embodiment, the first stage of processing may involve formation of fin structure 110 and gate structures 120a and 120b such that the first and second gates 121a and 121b, the first and second spacers 122a and 122b, and the dummy regions 114 all have tops at the first height. Subsequently, the first and second gates 121a and 121b may be recessed to the positions shown in FIGS. 2-4. An organic polymerization layer (OPL, not shown) may then be deposited on the first and second gates 121a and 121b up to the second height, followed by removal down to the top of the OPL of the first and second spacers 122a and 122b selective to the dummy oxide regions 114. The OPL may then be stripped to yield the depicted structure.

The first stage of processing also involves formation of an isolation region 340. The isolation region 340 comprises a shallow trench isolation (STI) 342 disposed between fins and the dummy oxide regions 114 shown in FIG. 1. The isolation region 340 may comprise the same oxide material as the dummy oxide regions 114, but need not.

Figure 5:
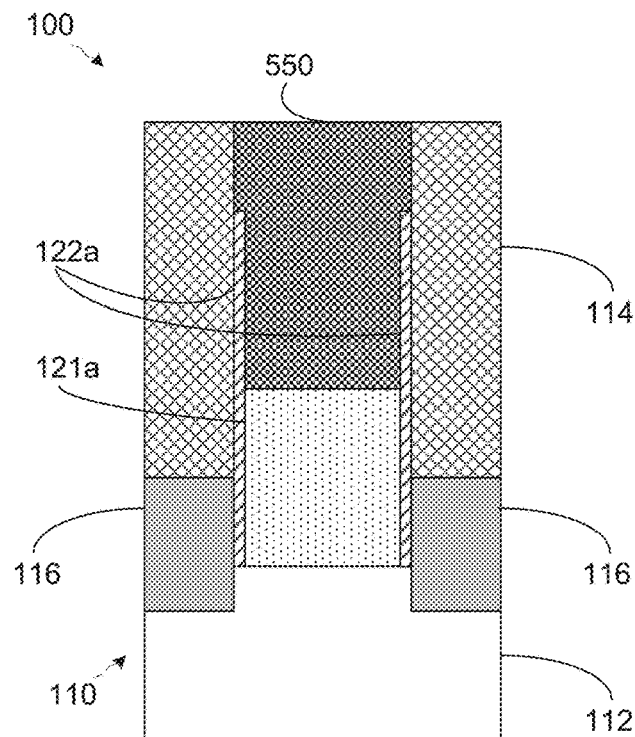
FIG. 5 illustrates a cross-sectional X1 cut view of a semiconductor device after a second stage of processing, in accordance with embodiments herein.
Figure 6:
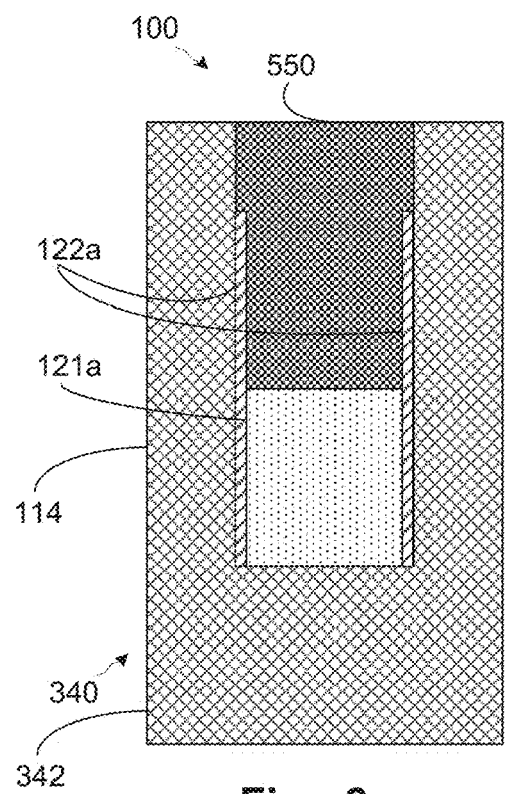
FIG. 6 illustrates a cross-sectional X2 cut view of a semiconductor device after a second stage of processing, in accordance with embodiments herein.
Figure 7:
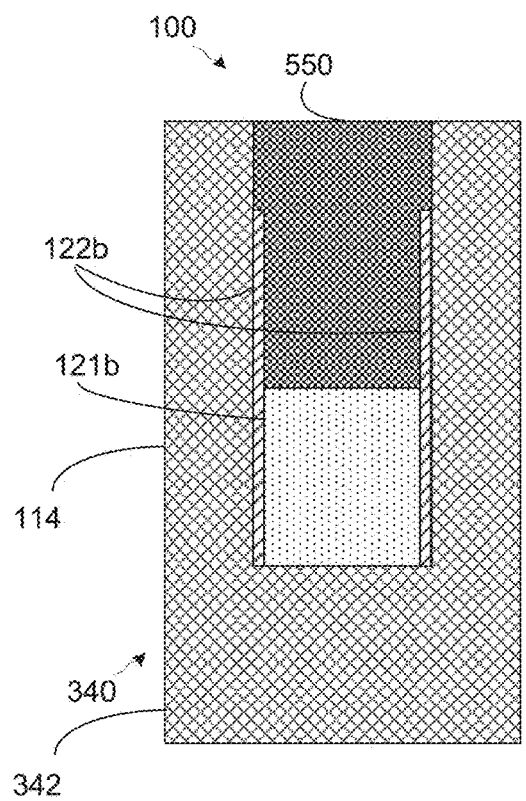
FIG. 7 illustrates a cross-sectional X3 cut view of a semiconductor device after a second stage of processing, in accordance with embodiments herein.

FIG. 5 illustrates a cross-sectional X1 cut view of the semiconductor device 100, FIG. 6 illustrates a cross-sectional X2 cut view of the semiconductor device 100, and FIG. 7 illustrates a cross-sectional X3 cut view of the semiconductor device 100, all after a second stage of processing, in accordance with embodiments herein. In the second stage of processing, each first T-shaped space 230 is filled with a first metal, to yield a plurality of T-shaped first metal formations 550. By filled is meant that the top of each T-shaped first metal formation 550 is at substantially the first height, i.e., is substantially coplanar with the dummy oxide regions 114.

Any suitable metal may be selected by the person of ordinary skill in the art having the benefit of the present disclosure as a routine matter. In one embodiment, the first metal is selected from tungsten or cobalt.

Regardless of the metal chosen as the first metal, the T-shaped first metal formations 550 may be formed by overfilling the spaces 230 with the first metal, followed by chemical-mechanical polishing (CMP) to yield the structures depicted in FIGS. 5-7.

Figure 8:
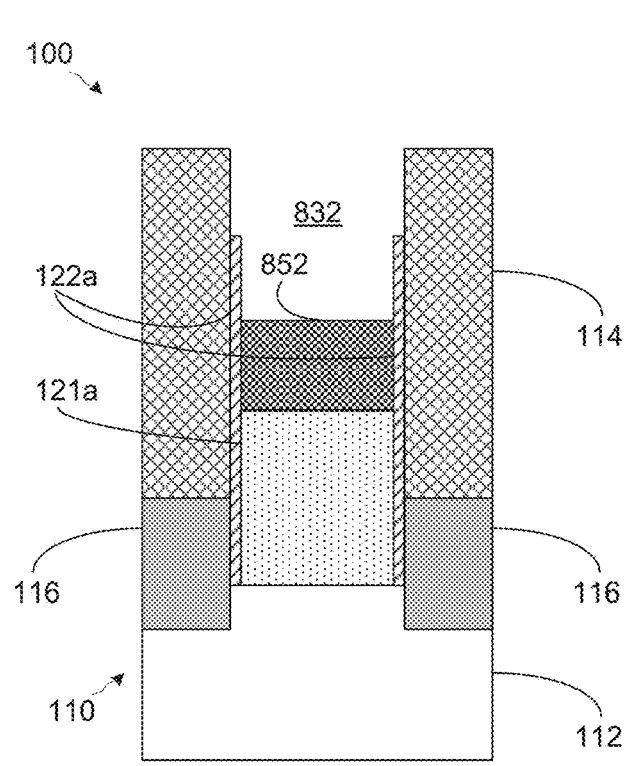
FIG. 8 illustrates a cross-sectional X1 cut view of a semiconductor device after a third stage of processing, in accordance with embodiments herein.
Figure 9:
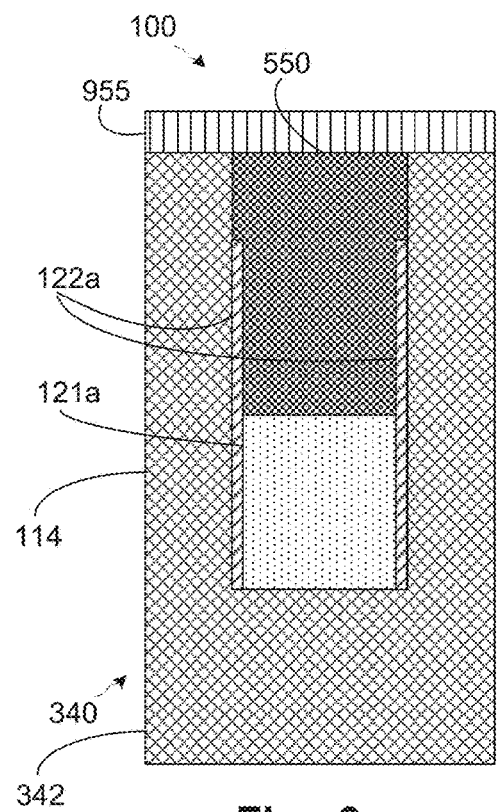
FIG. 9 illustrates a cross-sectional X2 cut view of a semiconductor device after a third stage of processing, in accordance with embodiments herein.
Figure 10:
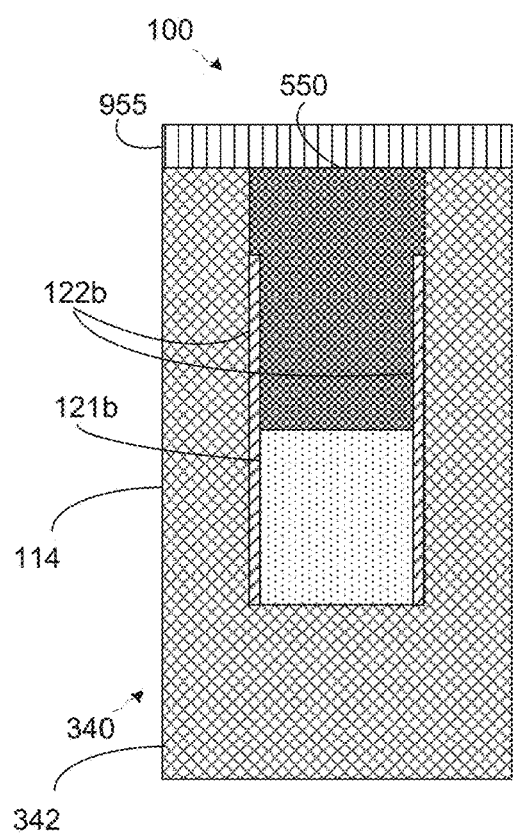
FIG. 10 illustrates a cross-sectional X3 cut view of a semiconductor device after a third stage of processing, in accordance with embodiments herein.

FIG. 8 illustrates a cross-sectional X1 cut view of the semiconductor device 100, FIG. 9 illustrates a cross-sectional X2 cut view of the semiconductor device 100, and FIG. 10 illustrates a cross-sectional X3 cut view of the semiconductor device 100 after a third stage of processing, in accordance with embodiments herein. In the third stage of processing, at least one T-shaped first metal formation 550, e.g., the T-shaped first metal formation 550 depicted in FIG. 8, is recessed to below the top of the spacer 122a (i.e., to below the second height) wherein at least one T-shaped first metal formation is not recessed, e.g., the T-shaped first metal formations 550 depicted in FIGS. 9-10. Recessing the at least one T-shaped first metal formation 550 shown in FIG. 8 while not recessing those shown in FIGS. 9-10 may involve applying a mask 955 or performing other lithographic techniques to protect at least some of the T-shaped first metal formations 550 disposed above the isolation region 340 from recession, followed by reactive ion etch (RIE) or other appropriate techniques to recess the at least one T-shaped first metal formation 550 as depicted in FIG. 8. RIE process materials and conditions may be selected as a routine matter by the person of ordinary skill in the art having the benefit of the present disclosure.

As shown in FIG. 8, recessing the at least one T-shaped first metal formation 550 yields at least one recessed first metal formation 852 and provides a second T-shaped space 832 above each recessed first metal formation 852.

Figure 11:
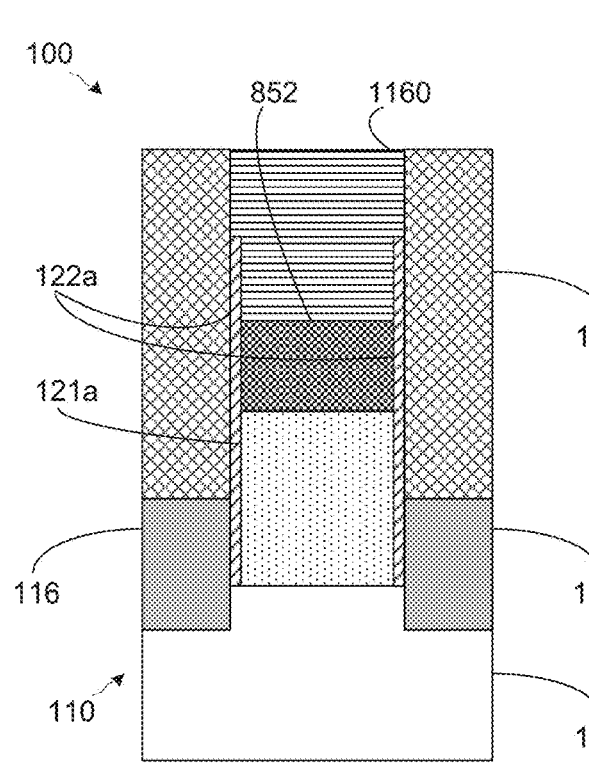
FIG. 11 illustrates a cross-sectional X1 cut view of a semiconductor device after a fourth stage of processing, in accordance with embodiments herein.
Figure 12:
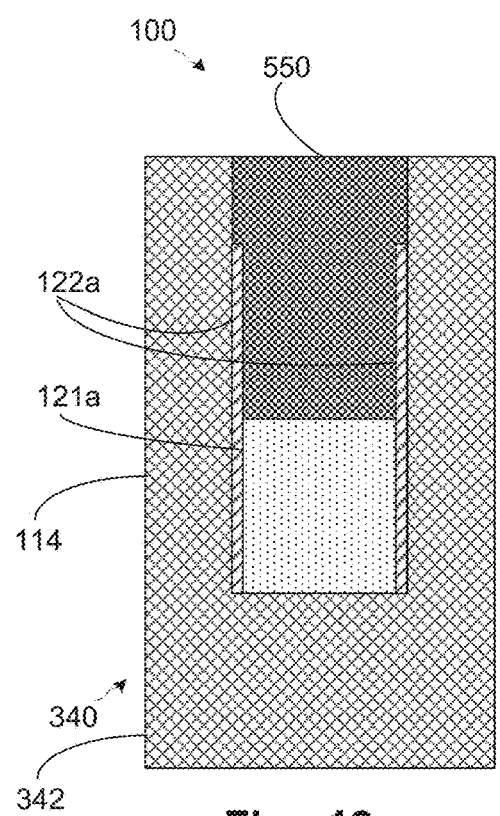
FIG. 12 illustrates a cross-sectional X2 cut view of a semiconductor device after a fourth stage of processing, in accordance with embodiments herein.
Figure 13:
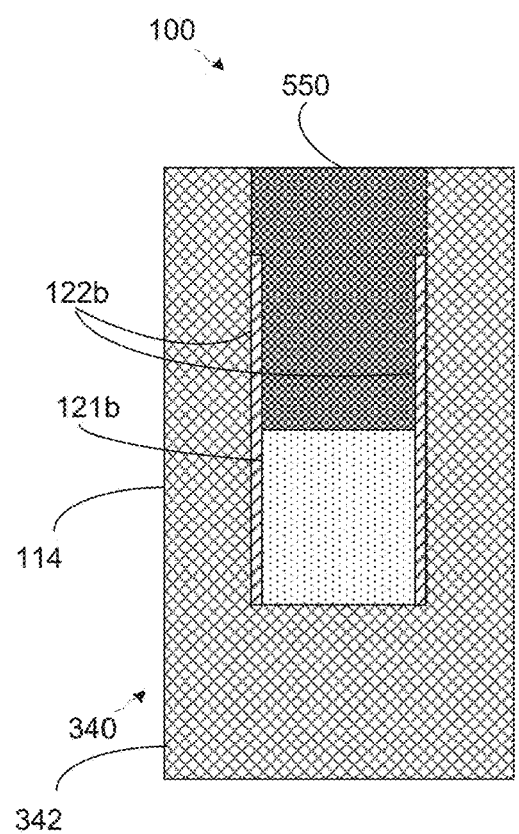
FIG. 13 illustrates a cross-sectional X3 cut view of a semiconductor device after a fourth stage of processing, in accordance with embodiments herein.

FIG. 11 illustrates a cross-sectional X1 cut view of the semiconductor device 100, FIG. 12 illustrates a cross-sectional X2 cut view of the semiconductor device 100, and FIG. 13 illustrates a cross-sectional X3 cut view of the semiconductor device 100 after a fourth stage of processing, in accordance with embodiments herein. In the fourth stage of processing, each second T-shaped space (element 832 previously shown in FIGS. 8-10) is filled with a nitride 1160. In one embodiment, the nitride 1160 is silicon nitride. Techniques for filling a space with nitride are known to the person of ordinary skill in the art and need not be described in detail. For example, the nitride 1160 may be deposited to overfill each second T-shaped space 832, followed by CMP or a similar process to planarize the nitride 1160 to be coplanar with the tops of dummy oxide regions 114.

FIGS. 12-13 show removal of the mask 955 from above T-shaped first metal formations 550. The mask 955 may be removed by any appropriate technique. In other embodiments, not shown, the mask 955 may be retained through the nitride filling fourth stage of processing and removed later.

Figure 14:
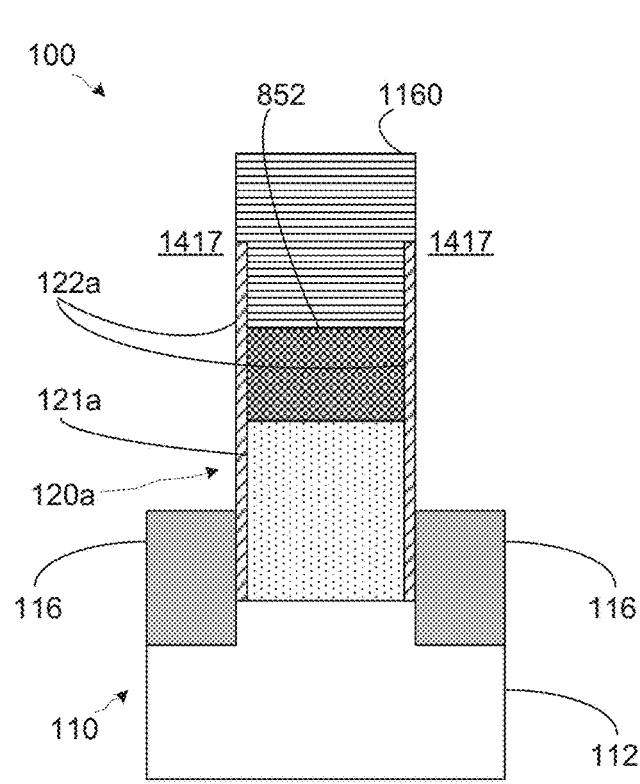
FIG. 14 illustrates a cross-sectional X1 cut view of a semiconductor device after a fifth stage of processing, in accordance with embodiments herein.
Figure 15:
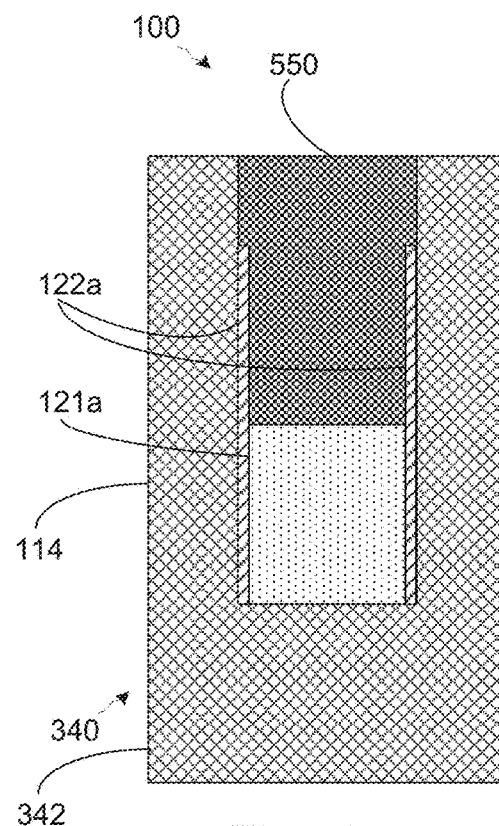
FIG. 15 illustrates a cross-sectional X2 cut view of a semiconductor device after a fifth stage of processing, in accordance with embodiments herein.
Figure 16:
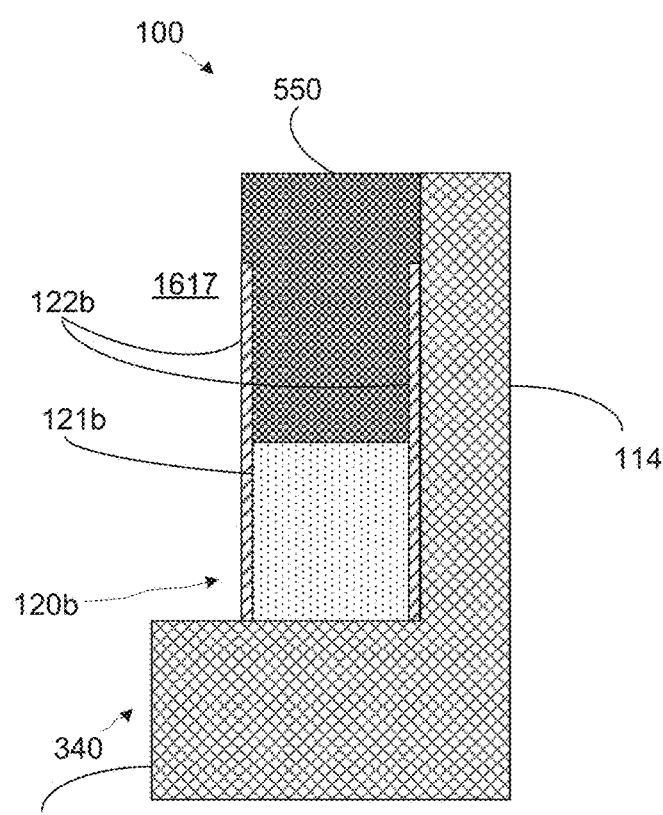
FIG. 16 illustrates a cross-sectional X3 cut view of a semiconductor device after a fifth stage of processing, in accordance with embodiments herein.

FIG. 14 illustrates a cross-sectional X1 cut view of the semiconductor device 100, FIG. 15 illustrates a cross-sectional X2 cut view of the semiconductor device 100, and FIG. 16 illustrates a cross-sectional X3 cut view of the semiconductor device 100 after a fifth stage of processing, in accordance with embodiments herein. In the fifth stage of processing, at least one of the dummy oxide regions 114 is removed, thereby providing at least one source/drain contact trench 1417. As a reminder, although only one gate structure 120a or 120b is depicted in each of FIGS. 2-19, a plurality of gate structures may be present, such that a vertical wall formed by a spacer 122a or 122b in a lower portion above a S/D region 116 or an STI 342, and in an upper portion by a nitride 1160 or a T-shaped first metal formation 550, may provide a second wall (not shown) of an S/D contact trench 1417 or isolation region trench 1617.

Removal of the at least one dummy oxide region 114 may be performed by masking or patterning the semiconductor device 100 to expose the dummy oxide region(s) 114 to be removed, followed by removal of the desired dummy oxide region(s) 114.

In addition to forming S/D contact trenches 1417 over S/D regions 116, the same process may be performed to form isolation region trenches 1617.

Figure 17:
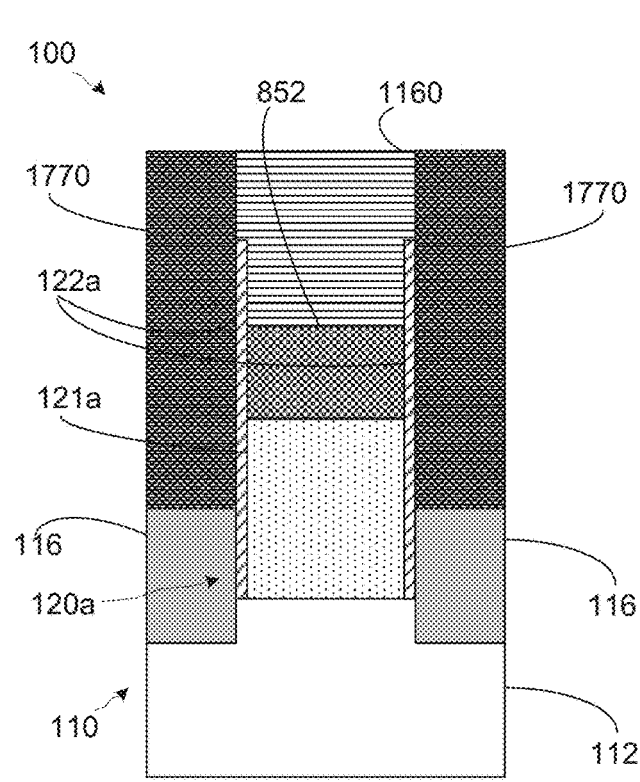
FIG. 17 illustrates a cross-sectional X1 cut view of a semiconductor device after a sixth stage of processing, in accordance with embodiments herein.
Figure 18:
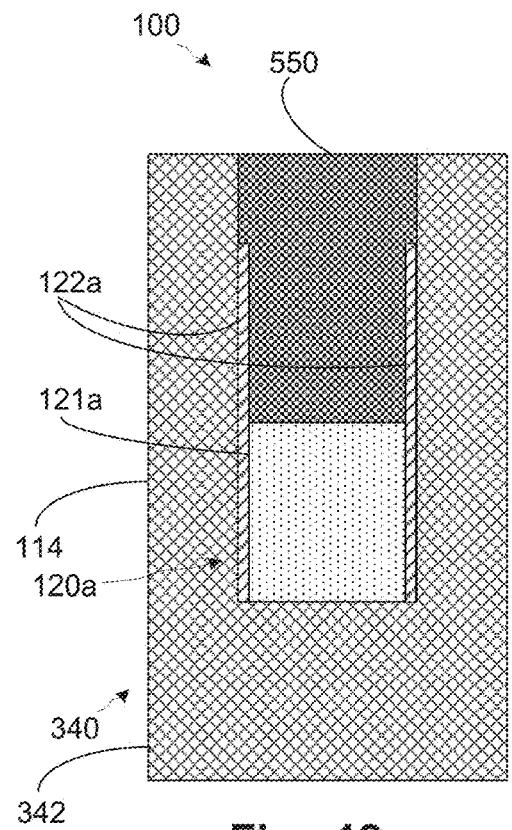
FIG. 18 illustrates a cross-sectional X2 cut view of a semiconductor device after a sixth stage of processing, in accordance with embodiments herein.
Figure 19:
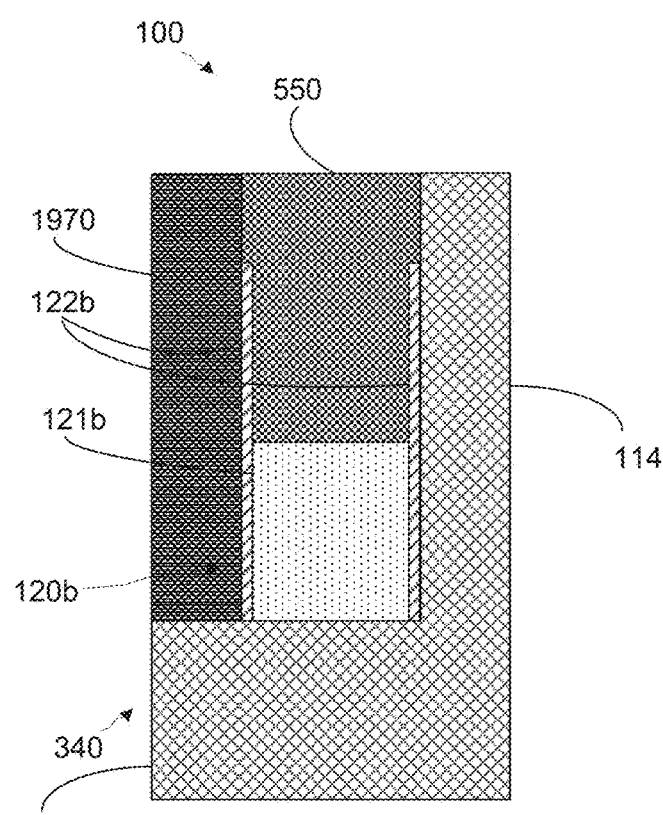
FIG. 19 illustrates a cross-sectional X3 cut view of a semiconductor device after a sixth stage of processing, in accordance with embodiments herein.

FIG. 17 illustrates a cross-sectional X1 cut view of a semiconductor device, FIG. 18 illustrates a cross-sectional X2 cut view of a semiconductor device, and FIG. 19 illustrates a cross-sectional X3 cut view of a semiconductor device after a sixth stage of processing, in accordance with embodiments herein. In the sixth stage of processing, each source/drain contact trench 1417 (previously shown in FIG. 14) and each isolation region trench 1617 (previously shown in FIG. 16) is filled with a second metal to yield filled S/D contact trenches 1770 and filled isolation region trenches 1970.

The particular second metal may be routinely selected by the person of ordinary skill in the art. The second metal may be the same as the first metal or may be different. In one embodiment, the second metal is selected from tungsten or cobalt.

As can be readily seen in FIG. 17, the nitride 1160 provides an electrically non-conductive structure between the filled S/D contact trenches 1770 and the recessed first metal formation 852. This reduces the likelihood of undesired electrical current flow between the gate 121a and the S/D regions 116 during operation of the semiconductor device 100.

On the other hand, where no S/D regions are present, such as on STI 342 in FIG. 18, the T-shaped first metal formation 550 has a wider top surface than it would if first spacer 122a extended up to the top of the dummy regions 114. Accordingly, less precision may be required when later forming a contact from the first gate 121a by way of the T-shaped first metal formation 550 to an overlying conductive element (not shown). This may improve the performance of the semiconductor device 100 during operation.

The filled isolation region trench 1970 may allow electrical current flow between the gate 121b and other conductive elements (not shown). This may impart improved performance to a final semiconductor device 100.

In subsequent processing steps, not shown, a metallization line or other conductive element may be formed above the structures shown in FIGS. 17-19 and contact may be formed. Other processing events may also be performed to yield a final semiconductor device 100.

In one embodiment, such as is depicted in FIGS. 17-19, the present disclosure relates to a semiconductor device 100, comprising a fin structure 110 comprising a fin body 112, source/drain regions 116, and a metal formation 1770 disposed above the source/drain regions 116, wherein the metal formation 1770 has a first height (i.e., the height of the top of the metal formation 1770); and a gate structure 120a between the source/drain regions, wherein each gate structure 120a comprises spacers 122a in contact with the metal formation 1770, wherein the spacers 122a have a second height less than the first height (i.e., the tops of the spacers 122a is below the top of the metal formation 1770), a metal plug 852 between the spacers 122a and below the second height (i.e., the top of the metal plug 852 is below the tops of the spacers 122a), and a T-shaped cap 1160 above the metal plug 852 and having the first height.

In one embodiment, the metal formation 1770 may comprise tungsten or cobalt.

Alternatively or in addition, the T-shaped cap 1160 may comprise a nitride, such as silicon nitride.

Alternatively or in addition, the source/drain regions 116 may be epitaxial source/drain regions each having a top above a top of the fin body 112.

Alternatively or in addition, the metal plug 852 may comprise tungsten or cobalt.

In one embodiment, the semiconductor device 100 may further comprise an isolation structure 340 comprising a shallow trench isolation (STI) 342 and a dummy oxide region 114 having the first height. The gate structure 120a may further comprise a T-shaped metal contact 550 having the first height and in contact with the dummy oxide region 114.

In a further embodiment, the isolation structure 340 may further comprise a metal formation 1970 having the first height and in contact with the T-shaped metal contact 550. The metal formation 1970 may comprise tungsten or cobalt.

Figure 20:
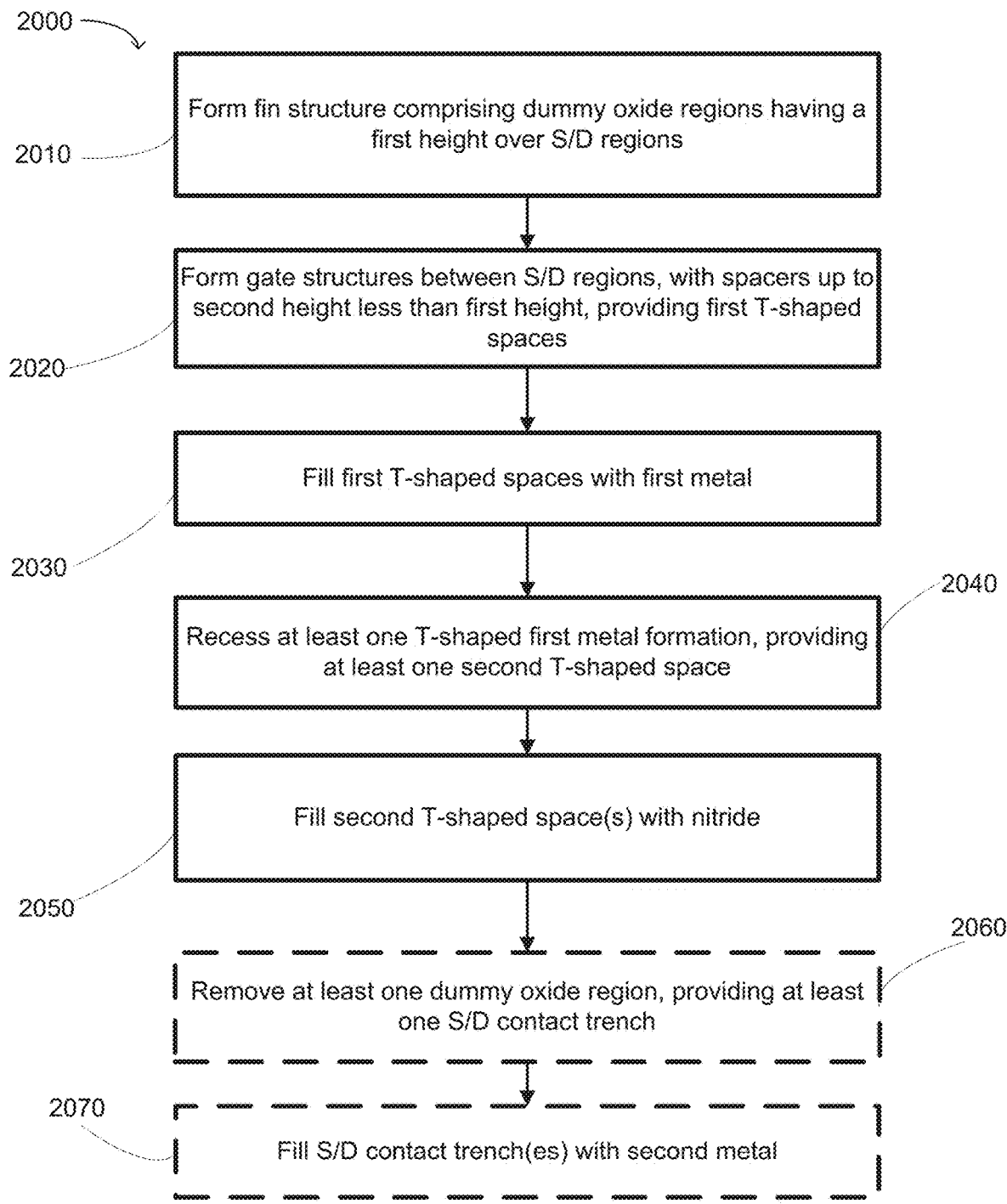
FIG. 20 illustrates a flowchart depiction of process steps of providing a semiconductor device, in accordance with embodiments herein.

Turning to FIG. 20, we illustrate a flowchart depiction of process steps of providing a semiconductor device, in accordance with embodiments herein. The process 2000 may include forming (at 2010) a fin structure comprising source/drain regions and dummy oxide regions disposed above the source/drain regions, wherein the dummy oxide regions have a first height. In one embodiment, the source/drain regions are epitaxial source/drain regions each having a top above a top of a fin body.

The process 2000 may also include forming (at 2020) gate structures between the source/drain regions, wherein each gate structure comprises spacers in contact with the dummy oxide regions, wherein the spacers have a second height less than the first height, thereby providing a first T-shaped space above each gate structure.

The process 2000 may also comprise filling (at 2030) each first T-shaped space with a first metal, to yield a plurality of T-shaped first metal formations. In one embodiment, the first metal is selected from tungsten or cobalt.

The process 2000 may additionally comprise recessing (at 2040) at least one T-shaped first metal formation to below the second height, thereby yielding at least one recessed first metal formation and providing a second T-shaped space above each at least one recessed first metal formation, wherein at least one T-shaped first metal formation is not recessed.

Yet further, the process 2000 may comprise filling (at 2050) each second T-shaped space with a nitride. In one embodiment, the nitride is silicon nitride.

In further embodiments, the process 2000 may comprise removing (at 2060) at least one of the dummy oxide regions, thereby providing at least one source/drain contact trench. In one embodiment, removing (at 2060) the at least one dummy oxide region further provides at least one isolation region trench adjacent to a T-shaped first metal formation that is not recessed.

The process 2000 may additionally further comprise filling (at 2070) each source/drain contact trench with a second metal. In one embodiment, the second metal is selected from tungsten or cobalt. Alternatively, or in addition, filling (at 2070) may further comprise filling at least one isolation region trench with the second metal such that the filled isolation region trench is in contact with the T-shaped first metal formation that is not recessed.

Figure 21:
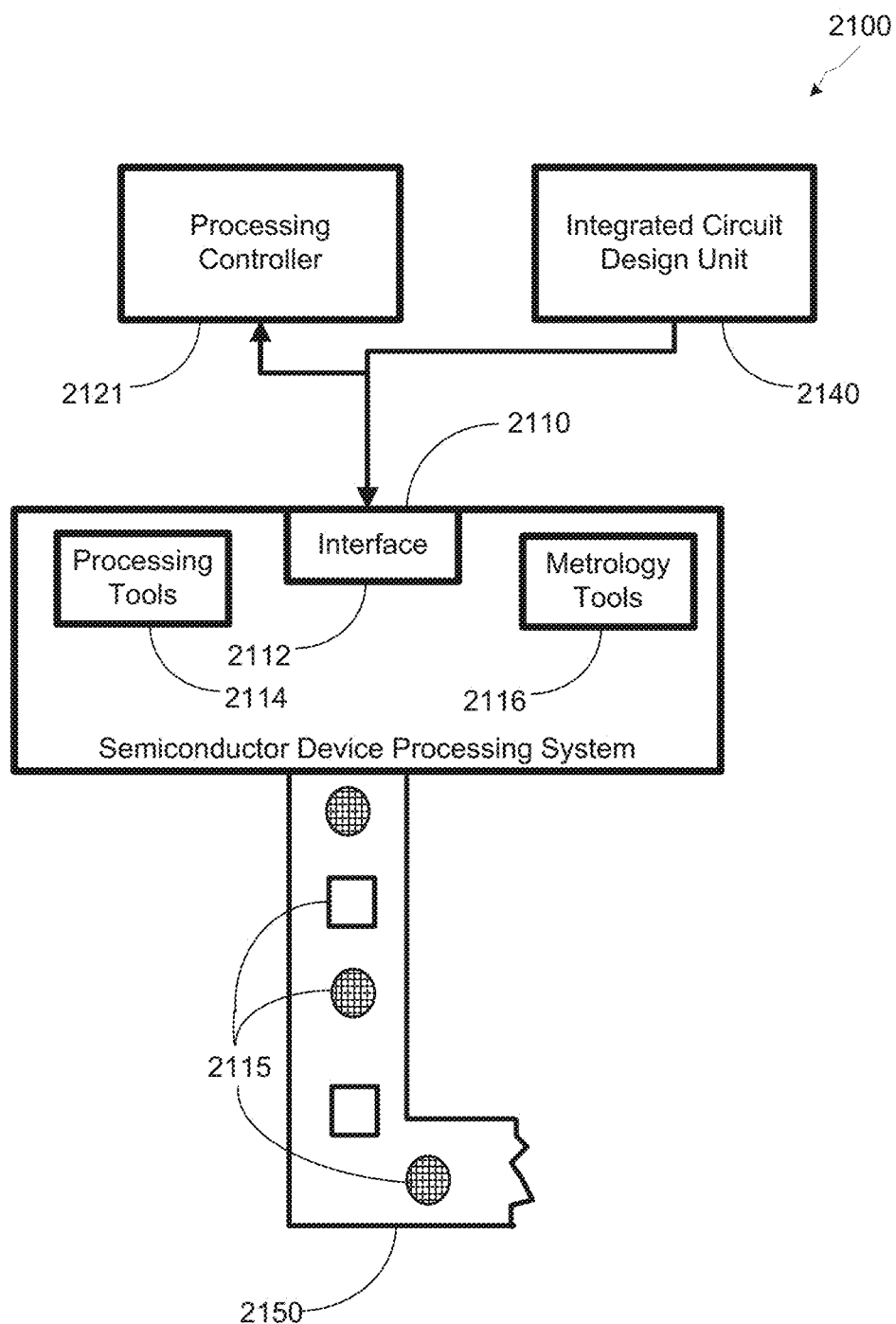
FIG. 21 illustrates a stylized depiction of a system for fabricating a semiconductor device, in accordance with embodiments herein.

Turning now to FIG. 21, a stylized depiction of a system 2100 for fabricating a semiconductor device, in accordance with embodiments herein, is illustrated. A system 2100 of FIG. 21 may include a semiconductor device processing system 2110 and an integrated circuit design unit 2140. The semiconductor device processing system 2110 may manufacture integrated circuit devices based upon one or more designs provided by the integrated circuit design unit 2140. The system 2100 is capable of performing at least one of the process steps described in FIGS. 2-19. The semiconductor device processing system 2110 is capable of implementing the process described in the flowchart of FIG. 20.

The semiconductor device processing system 2110 may include various processing stations, such as etch process stations, photolithography process stations, CMP process stations, etc. Each of the processing stations may include one or more processing tools 2114 and or metrology tools 2116. Feedback based on data from the metrology tools 2116 may be used to modify one or more process parameters used by the processing tools 2114 for performing process steps.

The semiconductor device processing system 2110 may also include an interface 2112 that is capable of providing communications between the processing tools 2114, the metrology tools 2116, and a controller, such as the processing controller 2120. One or more of the processing steps performed by the semiconductor device processing system 2110 may be controlled by the processing controller 2120. The processing controller 2120 may be a workstation computer, a desktop computer, a laptop computer, a tablet computer, or any other type of computing device including one or more software products that are capable of controlling processes, receiving process feedback, receiving test results data, performing learning cycle adjustments, performing process adjustments, etc.

The semiconductor device processing system 2110 may produce integrated circuits on a medium, such as silicon wafers. In one embodiment, the semiconductor device processing system 2110 may produce integrated circuits having semiconductor devices 100.

The production of integrated circuits by the semiconductor device processing system 2110 may be based upon the circuit designs provided by the integrated circuits integrated circuit design unit 2140. The semiconductor device processing system 2110 may provide processed integrated circuits/devices 2115 on a transport mechanism 2150, such as a conveyor system. In some embodiments, the conveyor system may be sophisticated clean room transport systems that are capable of transporting semiconductor wafers. In one embodiment, the semiconductor device processing system 2110 may include a plurality of processing steps, e.g., the $1^{st}$ process step, the $2^{nd}$ process step, etc., as described above.

In some embodiments, the items labeled "2115" may represent individual wafers, and in other embodiments, the items 2115 may represent a group of semiconductor wafers, e.g., a "lot" of semiconductor wafers. The integrated circuit or device 2115 may be a transistor, a capacitor, a resistor, a memory cell, a processor, and/or the like. In one embodiment, the device 2115 is a transistor and the dielectric layer is a gate insulation layer for the transistor.

The integrated circuit design unit 2140 of the system 2100 is capable of providing a circuit design that may be manufactured by the semiconductor device processing system 2110. This may include information regarding the components of the semiconductor device 100 described above. For example, this information may include the positions and dimensions of T-shaped caps 1160, filled S/D contact trenches 1770, and/or filled isolation region trenches 1970.

The integrated circuit design unit 2140 may be capable of determining the number of devices (e.g., processors, memory devices, etc.) to place in a device package. The integrated circuit design unit 2140 may also determine the height of the fins, the dimensions of the S/D regions, the dimensions of the gates, etc. These dimensions may be based upon data relating to drive currents/performance metrics, device dimensions, etc. Based upon such details of the devices, the integrated circuit design unit 2140 may determine specifications of the semiconductor devices 100 that are to be manufactured. Based upon these specifications, the integrated circuit design unit 2140 may provide data for manufacturing a semiconductor device 100 described herein.

The system 2100 may be capable of performing analysis and manufacturing of various products involving various technologies. For example, the system 2100 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 2100 to fabricate the semiconductor devices 100 described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
   a fin structure comprising a fin body, source/drain regions, and a metal formation disposed above the source/drain regions, wherein the metal formation has a first height;
   an isolation structure comprising a shallow trench isolation (STI) and a dummy oxide region, wherein the dummy oxide region is disposed on the STI and the dummy oxide region has the first height and a gate structure between the source/drain regions, wherein each gate structure comprises spacers in contact with the metal formation, wherein the spacers have a second height less than the first height, a metal plug between the spacers and below the second height, and a T-shaped cap above the metal plug and having the first height.

2. The semiconductor device of claim 1,
   wherein the gate structure further comprises a T-shaped metal contact having the first height and in contact with the dummy oxide region.

3. The semiconductor device of claim 1, wherein the isolation structure further comprises:
   a metal formation having the first height and in contact with the T-shaped metal contact.

4. The semiconductor device of claim 1, wherein the metal formation comprises tungsten or cobalt.

5. The semiconductor device of claim 1, wherein the T-shaped cap comprises silicon nitride.

6. The semiconductor device of claim 1, wherein the source/drain regions are epitaxial source/drain regions each having a top above a top of the fin body.

7. The semiconductor device of claim 1, wherein the metal plug comprises tungsten or cobalt.

8. A method, comprising:
   forming a fin structure comprising source/drain regions and dummy oxide regions disposed above the source/drain regions, wherein the dummy oxide regions have a first height;
   forming gate structures between the source/drain regions, wherein each gate structure comprises spacers in contact with the dummy oxide regions, wherein the spacers have a second height less than the first height, thereby providing a first T-shaped space above each gate structure;
   filling each first T-shaped space with a first metal, to yield a plurality of T-shaped first metal formations;
   recessing at least one T-shaped first metal formation to below the second height, thereby yielding at least one recessed first metal formation and providing a second T-shaped space above each at least one recessed first metal formation, wherein at least one T-shaped first metal formation is not recessed; and
   filling each second T-shaped space with a nitride.

9. The method of claim 8, wherein the first metal is selected from tungsten or cobalt.

10. The method of claim 8, wherein the nitride is silicon nitride.

11. The method of claim 8, wherein the source/drain regions are epitaxial source/drain regions each having a top above a top of a fin body.

12. The method of claim 8, further comprising:
    removing at least one of the dummy oxide regions, thereby providing at least one source/drain contact trench; and
    filling each source/drain contact trench with a second metal.

13. The method of claim 12, wherein the second metal is selected from tungsten or cobalt.

14. The method of claim 12, wherein the removing the at least one dummy oxide region further provides at least one isolation region trench adjacent to a T-shaped first metal formation that is not recessed, and the filling further comprises filling the at least one isolation region trench with the second metal such that the filled isolation region trench is in contact with the T-shaped first metal formation that is not recessed.

15. A system, comprising:
    a semiconductor device processing system to manufacture a semiconductor device; and
    a processing controller operatively coupled to said semiconductor device processing system, said processing controller configured to control an operation of the semiconductor device processing system;
    wherein the semiconductor device processing system is adapted to:
    form a fin structure comprising source/drain regions and dummy oxide regions disposed above the source/drain regions, wherein the dummy oxide regions have a first height;
    form gate structures between the source/drain regions, wherein each gate structure comprises spacers in contact with the dummy oxide regions, wherein the spacers have a second height less than the first height, thereby providing a first T-shaped space above each gate structure;
    fill each first T-shaped space with a first metal, to yield a plurality of T-shaped first metal formations;
    recess at least one T-shaped first metal formation to below the second height, thereby yielding at least one recessed first metal formation and providing a second T-shaped space above each at least one recessed first metal formation, wherein at least one T-shaped first metal formation is not recessed; and
    fill each second T-shaped space with a nitride.

16. The system of claim 15, wherein the semiconductor device processing system is adapted to fill each first T-shaped space with tungsten or cobalt.

17. The system of claim 15, wherein the semiconductor device processing system is adapted to fill each second T-shaped space with silicon nitride.

18. The system of claim 15, wherein the semiconductor device processing system is adapted to form the source/drain regions as epitaxial source/drain regions each having a top above a top of a fin body.

19. The system of claim 15, wherein the semiconductor device processing system is further adapted to:
  remove at least one of the dummy oxide regions, thereby providing at least one source/drain contact trench; and
  fill each source/drain contact trench with a second metal.

20. The system of claim 19, wherein the semiconductor device processing system is adapted to remove at least one dummy oxide region to provide at least one isolation region trench adjacent to a T-shaped first metal formation that is not recessed, and is adapted to fill the at least one isolation region trench with the second metal such that the filled isolation region trench is in contact with the T-shaped first metal formation that is not recessed.

\* \* \* \* \*